United States Patent [19]
Wood

[11] Patent Number: 5,420,419
[45] Date of Patent: May 30, 1995

[54] CAMERA FOR PRODUCING VIDEO OUTPUT SIGNAL, INFRARED FOCAL PLANE ARRAY PACKAGE FOR SUCH CAMERA, AND METHOD AND APPARATUS FOR GENERATING VIDEO SIGNALS FROM PASSIVE FOCAL PLANE ARRAY OF ELEMENTS ON A SEMICONDUCTOR SUBSTRATE

[75] Inventor: R. Andrew Wood, Bloomington, Minn.

[73] Assignee: Honeywell Inc., Minneapolis, Minn.

[21] Appl. No.: 203,739

[22] Filed: Feb. 28, 1994

Related U.S. Application Data

[63] Continuation of Ser. No. 901,437, Jun. 19, 1992, abandoned.

[51] Int. Cl.6 .............................................. H01L 27/14
[52] U.S. Cl. ................................. 250/338.4; 250/352; 250/370.15; 338/17; 338/18
[58] Field of Search ................ 250/370.15, 352, 336.2, 250/338.4; 338/17, 18

[56] References Cited

U.S. PATENT DOCUMENTS

| | | | |
|---|---|---|---|
| 3,900,716 | 8/1975 | Kawabata et al. | 235/460 |
| 3,900,883 | 8/1975 | Hasegawa et al. | 338/17 |
| 4,230,945 | 10/1980 | Meir et al. | 250/370.15 |
| 4,654,622 | 3/1987 | Foss et al. | 338/14 |
| 5,012,102 | 4/1991 | Gowlett | 250/352 |
| 5,129,595 | 7/1992 | Thiede et al. | 244/3.16 |

FOREIGN PATENT DOCUMENTS 62-21024  1/1987  Japan ................................. 250/352

*Primary Examiner*—Constantine Hannaher
*Attorney, Agent, or Firm*—Paul H. McDowall; Kenneth J. Johnson

[57] ABSTRACT

A camera system primarily for infrared radiation having a focal plane array of microbolometer elements in a vacuum package with inexpensive thermoelectric temperature stabilization is shown. The stabilization temperature may be selected by a designer or a user over a wide range of temperatures, but room temperature use is primarily expected. The microbolometers are passive elements and the readout scheme involves a sweep of the array with a short duration pulse-high level bias current.

19 Claims, 5 Drawing Sheets

CAMERA FOR PRODUCING VIDEO OUTPUT SIGNAL, INFRARED FOCAL PLANE ARRAY PACKAGE FOR SUCH CAMERA, AND METHOD AND APPARATUS FOR GENERATING VIDEO SIGNALS FROM PASSIVE FOCAL PLANE ARRAY OF ELEMENTS ON A SEMICONDUCTOR SUBSTRATE

This application is a continuation of application Ser. No. 07/901,437, filed 19 Jun. 1992 now abandoned.

FIELD OF THE INVENTION

This invention relates to the art of video imaging and has particular applicability to video cameras capable of producing visual images from infrared radiation and even more particularly to providing such images at relatively low cost.

BACKGROUND OF THE INVENTION

This invention applies to a new type of radiation-sensitive focal plane operating near room temperature: a two-dimensional array of microminiature bolometers (microbolometers). This invention describes 1) an apparatus and method of using such focal planes in an IR imaging camera without the necessity to use a chopper; 2) an apparatus and method for efficiently retrieving the information contained in the focal plane; and 3) a camera system in which these focal planes can operate to produce video output signals.

SUMMARY OF THE INVENTION

The camera system described in this invention has a radiation receiving system including preferably a lens, reflective or other optical system assembly with an iris to focus the scene on a focal plane array contained within a vacuum chamber. The light receiving surface or "window" of the vacuum chamber is invisible to the wavelengths of radiation desired to be recorded or received by the focal plane array.

The vacuum package contains the focal plane array affixed to one surface of a thermoelectric temperature stabilizer. On the thermoelectric temperature stabilizer or the substrate of the focal plane array is a temperature sensing device. This whole assembly is then fixed into the base and supporting structure of the vacuum chamber. Electrical connections are made through the wall of the vacuum chamber to the various components within it and this allows for a bias current to be pulsed to specific focal plane array elements at specific instants in time so that they will produce an output related to the radiation received thereby. Control leads for the thermoelectric temperature stabilizer also pass through the vacuum chamber and allow for it to be temperature stabilized based on the temperature sensed by the temperature sensor. A high stability bias source provides voltage at a constant level to be sent via a decoder to the particular focal plane array elements to be sensed in a sweep. The output of each element is received by a preamplifier, the output of which is translated into a digital signal and forwarded to an image processor which produces a video output.

In the preferred embodiment, the window to the vacuum chamber through which the radiation passes is transparent only to infrared and the focal plane array consists of microbolometer elements appropriately spaced upon the array to dissipate heat similarly to the microbolometer focal plane arrays described in U.S. Pat. Nos. 5,220,188 and 5,220,189, as well as U.S. patent application Ser. Nos. 06/887,495, 07/172,118 and 07/035,118.

DETAILED DESCRIPTION OF THE PREFERRED EMBODIMENTS

The Camera

Figure 1:
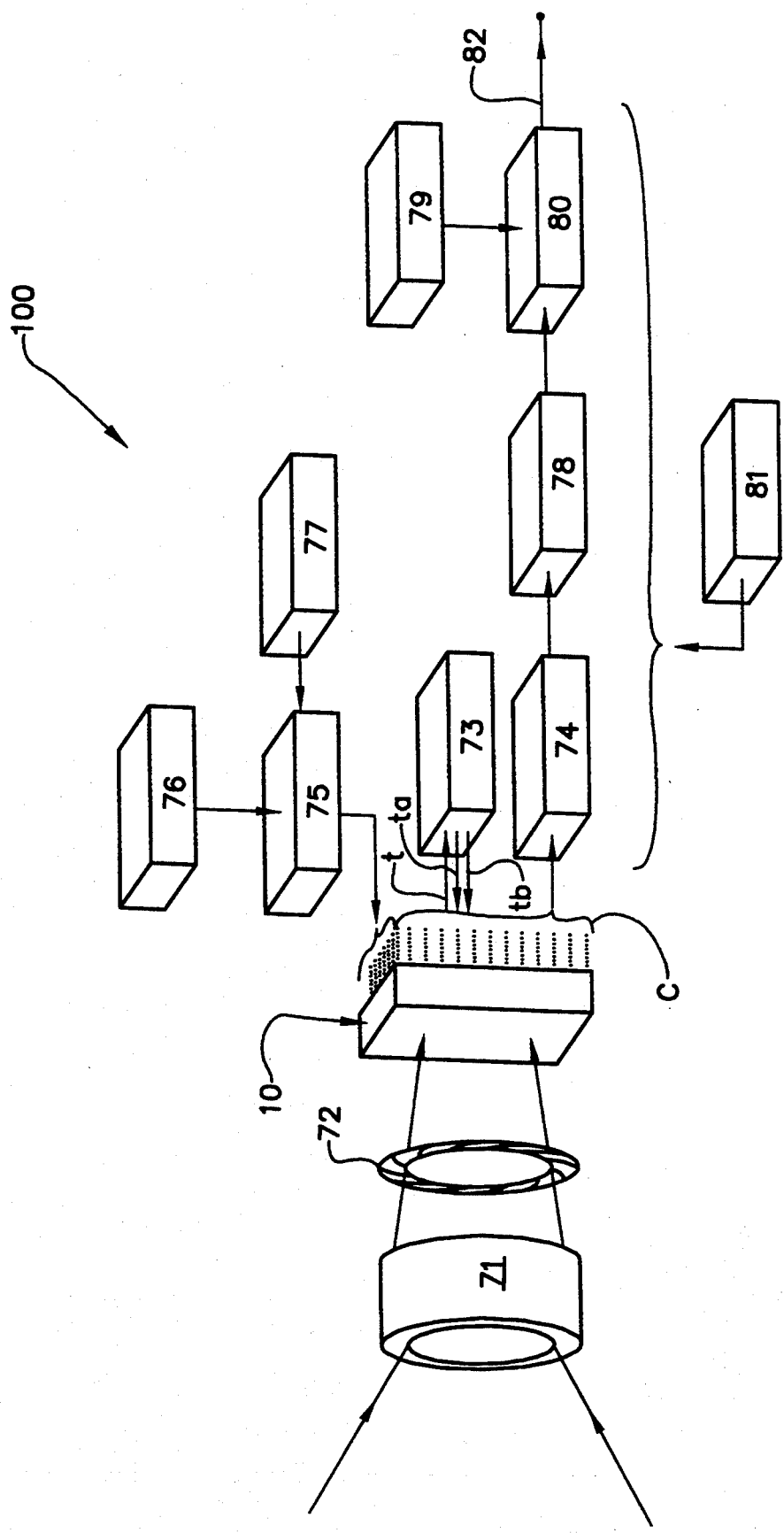
FIG. 1 is a three-dimensional block diagram of the major components of the preferred embodiment camera.

Referring first to FIG. 1, the layout of the camera 100 is shown. Light or radiation received by the lens or reflective optical system 71 enters through the iris 72 to the surface of the window on the package 10 or vacuum chamber 10 containing the focal plane array (not shown). Small dotted lines c indicate that many pins connect the package 10 to the rest of the camera electrically.

The temperature of the focal plane array is kept constant by a thermoelectric controller 73 which sets the temperature based on the output of a temperature sensor inside the package 10. The temperature at which the array is kept is referred to as a stabilization temperature. For the microbolometers we used, the range at which this has been tested is from zero to 30° C., although there is no reason much higher or lower stabilization temperatures could not be used.

A line t indicates that temperature information is received by the thermoelectric controller. If the temperature information is what is desired, no signals will be sent over the other lines $t_a$ and $t_b$. However, in the preferred embodiment the thermoelectric controller will be controlled by sending power over either line $t_a$ or $t_b$ depending on the direction (warmer or cooler) of the desired change in temperature.

The passive elements of the focal plane array in the package 10 need to be polled or interrogated by providing a voltage or a current. Accordingly, an array bias is produced by an array bias block 76, this electrical unit being a highly stable (low noise, low drift) voltage supply in the preferred embodiment. The inventors have had some success using a simple battery, although certainly other sources well known to those in the art could be employed. The voltage must be provided to the passive elements in the array in some sequence in the preferred embodiment. Accordingly, a set of decoders 75 is used which is controlled by a logic controller 77. The logic controller 77 will steer the current by controlling the decoders (essentially operating as a large multiplexer) in a sweeping sequence such that each row by column address is polled over a sweep one time before being polled again in the second sweep. The decoders then steer the bias current provided by the array bias 76 to the appropriate pins c attached to the package 10.

Output pins c are all connected to a set of preamplifiers illustrated here as block 74. The output of these preamplifiers may be taken either serially or in a buffered form by an analog to digital conversion module 78 which can then provide a digital indication of the value of the analog signal level input thereto for each output from each preamplifier. The electrical characteristics of the preamplifier are designed to be stable with time and temperature, or correction for such changes are applied in the image processor. The inventors have had some success with the latter technique, employing calibration signals injected into the preamplifiers. Alternatively, this may be attained by temperature- and time-independent circuit designs well known to those in the art.

In this camera, is also provided an image processor 80 to which a driver's console 79 is in electrical and controlling contact. In other words, by controlling how the digital values are received which are already in the image processor, an operator can change the sensitivity, receive freeze-frame information and variously correct or change the video signal which will be output by the image processor 80. Image processors are fairly well known in the art of video cameras and generally use digital signal processing circuits and various adjustments to the incoming input signal to produce an output video signal here illustrated on line 82.

Software control is the preferred embodiment since the algorithms normally used are most conveniently implemented by software, rather than by hard-wired logic. In this way we can implement things which are difficult to implement in hardware, because different algorithms are required at different instants in time, and because signals from different areas of the array may be treated with different processing algorithms.

Some advantages are inherent in this camera design which are not readily apparent.

The iris may be closed momentarily (e.g., after camera manufacture, or at camera start-up) to allow the image processor 80 to average several image frames and store this digital data in a long-lived digital memory (which may be in the image processor systems). A simple expedient of a lens cap or shutter may be employed instead, if desired. During normal camera operation the iris 72 remains permanently open, or partially closed if it is desired to reduce the radiation intensity falling on the focal plane. The image processor subtracts the incoming signals from the digital data in its long-lived memory on a pixel-by-pixel basis. This provides offset correction for each pixel in the image to be viewed by a human observer, a requirement and process well known to those in the art. Provided the focal plane remains maintained at a stable temperature by the TE stabilizer, the preamplifier electrical characteristics do not change, and no change is made to the array electrical polling, no chopper is required to interrupt the radiation from the scene. The absence of a chopper produces many desirable benefits: a cheaper and more reliable camera, a lower electronic speed requirement, and elimination of the sensitivity loss produced by the periodic radiation obstruction of a chopper.

The Package for the Array

Figure 2:
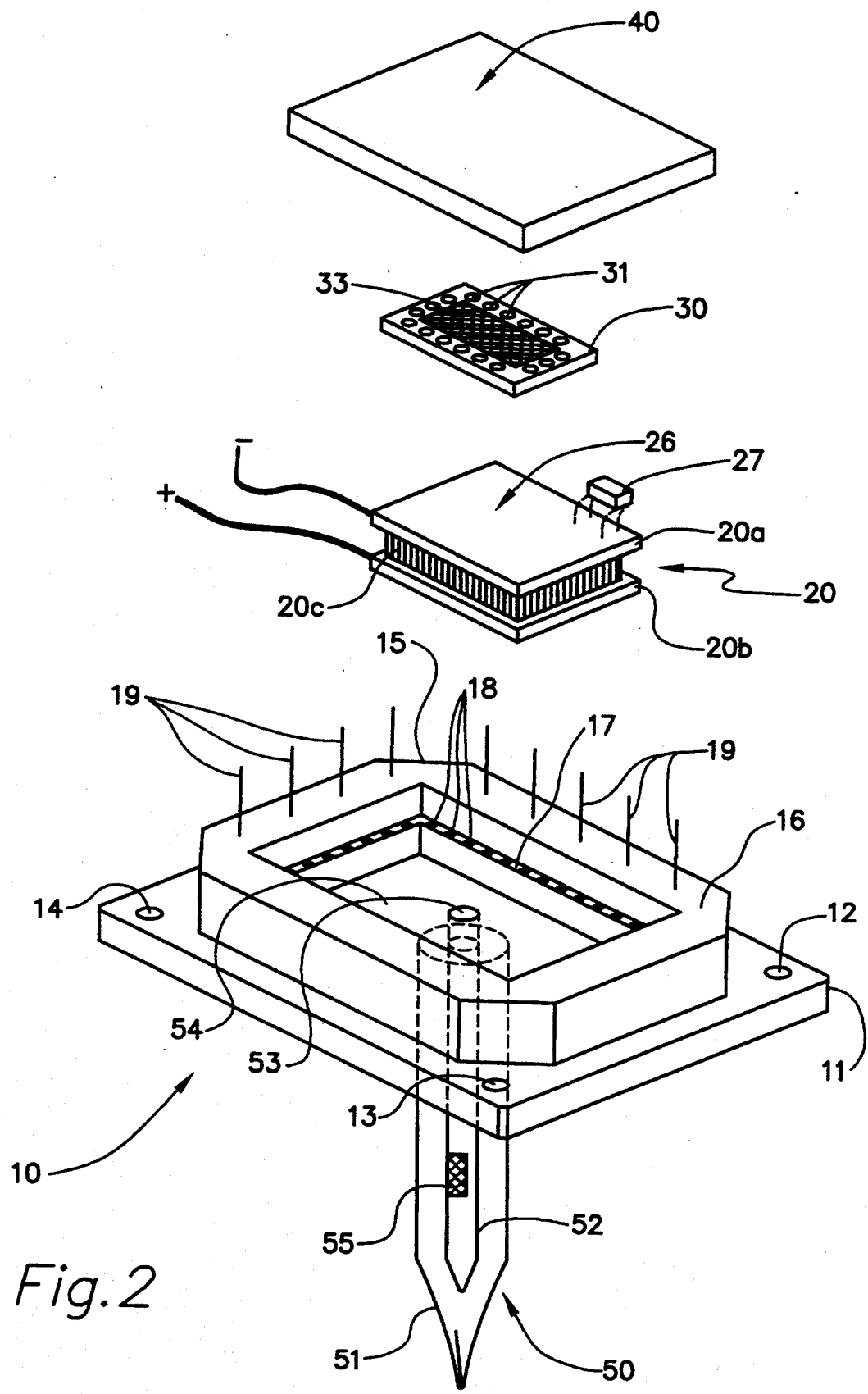
FIG. 2 is an exploded view of the vacuum package.

Referring to FIG. 2, the vacuum package 10 is shown in an exploded view. The package consists of a base plate 11 containing apertures 12, 13, 14, and 15(not shown) for connecting it to the camera, a surrounding wall structure 16, having an internal step 17, on which are located pads 18. Wires 19, of which only a few are shown, are connected to these pads. Basically, this exploded view and its limited elements is shown for illustrative purposes only and not to be taken in a limiting way.

The wall 16 surrounds a bounded area 54 within which there is an aperture 53 in the upper surface of base plate 11. The aperture extends into a tube 50 whose inner space is defined by dotted lines 52 and which in the final preferred embodiment product is crimped off at 51. A getter 55 may also be used. A thermoelectric temperature stabilizer 20 fits into the bounded space 54 in the finished package. The thermoelectric temperature stabilizer consists generally (in the preferred embodiment) of an upper plate 20a and a lower plate 20b of what is usually beryllium oxide sandwiching a layer of other materials such as bismuth and/or antimony, or other suitable materials known in the art. Power leads "−" and "+" provide power to either one of the plates thus either cooling or warming the device. The surfaces such as upper surface 26 are metallized for bonding preferably by solder to either the upper surface of substrate 11 on the one side or the lower surface of the focal plane array to surface 26. A temperature sensing device 27 in the preferred embodiment, for simplicity's sake a thermistor, is also attached to the surface 26 of the thermoelectric temperature stabilizer 20. Numerous temperature sensors are currently under development or readily available and, depending on the economics, may also be employed. If the temperature sensor is small enough it could even reside on the focal plane array chip itself. This would be left up to the needs and desires of the designer. All that is necessary is that a very accurate reading of the temperature of the focal plane array be given by the temperature sensing device.

Also, the inventors have had some success using temperature sensors fabricated on the focal plane array chips. These sensors are periodically polled by the focal plane readout electronics in the same way as the microbolometers, and the temperature data is sent to the image processor in the same way as the microbolometer signals. The inventors have had some success in using the image processor to use these temperature signals to improve the image quality by correcting for small temperature drifts in the cameras. These could be microbolometers which are intentionally made unresponsive to infrared radiation.

The focal plane array chip 30 has bonding pads or leads 31 preferably around its edges. The focal plane array elements which are sensitive to radiation are in area 33 in the preferred embodiment chip. If a temperature sensor were employed on the focal plane array, it would most likely be preferred to be included in area 33.

Topping off the package is a window 40 which is transparent to the type of radiation expected and desired to be received by the focal plane array 33. The lower peripheral edges of this window should be metallized in the preferred embodiment to permit soldering. For the most desired embodiment at the current time, the focal plane array elements are passive microbolometer elements coated with vanadium oxide which produce a change in resistivity based on the amount of infrared radiation received by each element in a way related to that disclosed in U.S. patent application Ser. No. 07/035,118. In this infrared sensitive preferred embodiment a germanium window that is anti reflective is employed for window 40. In the currently preferred embodiment package, the base 11 and its surrounding wall 16 is a custom integrated circuit package produced by Kyocera of Japan made of aluminum oxide (Al₂O₃) for the wall with a base plate of a copper alloy. The preferred embodiment tube is copper and the getter is a metallic alloy well known to those in the art, activated far from the device after the tube is used for pumping out the air within the sealed package 10. The getter is then pushed up close toward the package in the tube 50 and the package is sealed off by crimping the tube at 51. In the preferred embodiment solder is used for everything but electrical connections which are bonded. However, as technology and practice improves, attaching the electrical leads and the components together may be done in different ways within the scope of this invention. Likewise, any materials which would readily substitute for those described hereabove may also be substituted without going beyond the scope of this invention.

Figure 3:
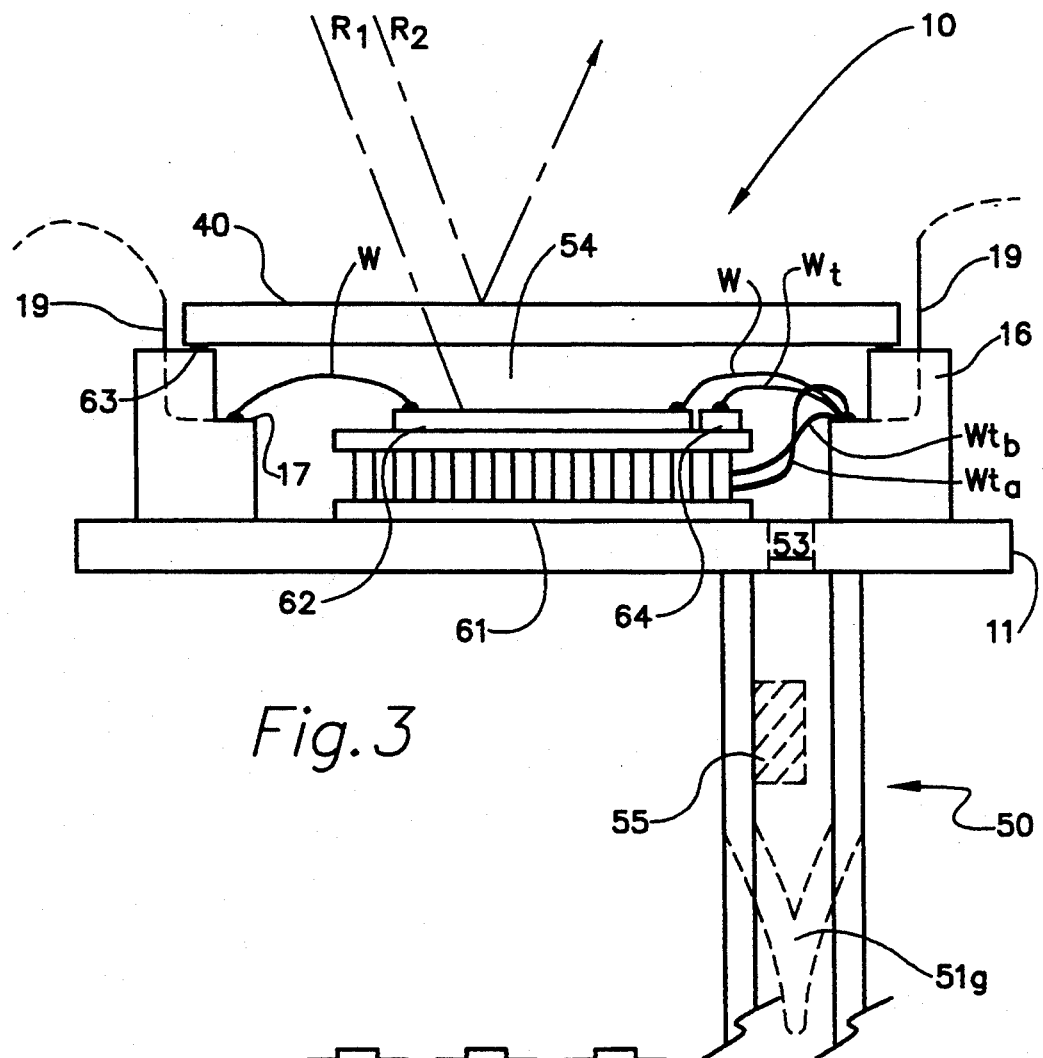
FIG. 3 is a side view of the vacuum package.

Referring now to FIG. 3, a side view of the package 10 is shown having the copper tube 50 bonded to the base plate 11 with the getter 55 inside. The electrical wires, w, wt, wt$_b$, and wt$_a$, provide power and readout to and from the three devices in the vacuum space 53. The leads or pads on step 17 from these wires are connected through wall 16 to wires 19 which may then bonded to connectors to external elements such as the preamplifiers in block 74 of FIG. 1, the thermoelectric controller of block 73 of FIG. 1, and the decoders supplying the bias voltage through block 75 of FIG. 1. Radiation which reaches the window 40 in the right wavelength (R1) will go through the window. Radiation which is not of the right wavelength (R2) will be reflected off of the window 40 or absorbed by it. As stated before, the various surfaces are held together in the preferred embodiment by soldering such that joints 61, 62, 63, and 64 would be solder connections. As also described before, these connections may be made by other means but presently soldering is preferred.

With reference to the thermoelectric temperature stabilizer 20, these devices are currently available from several manufacturers, the preferred source currently being Marlow Industries of Dallas, Tex. For an infrared sensing focal plane array having 80,000 elements, a preferred thermoelectric cooling device would be Marlow Industries model number SP5030-03-BC.

Readout From Passive Elements

Figure 4:
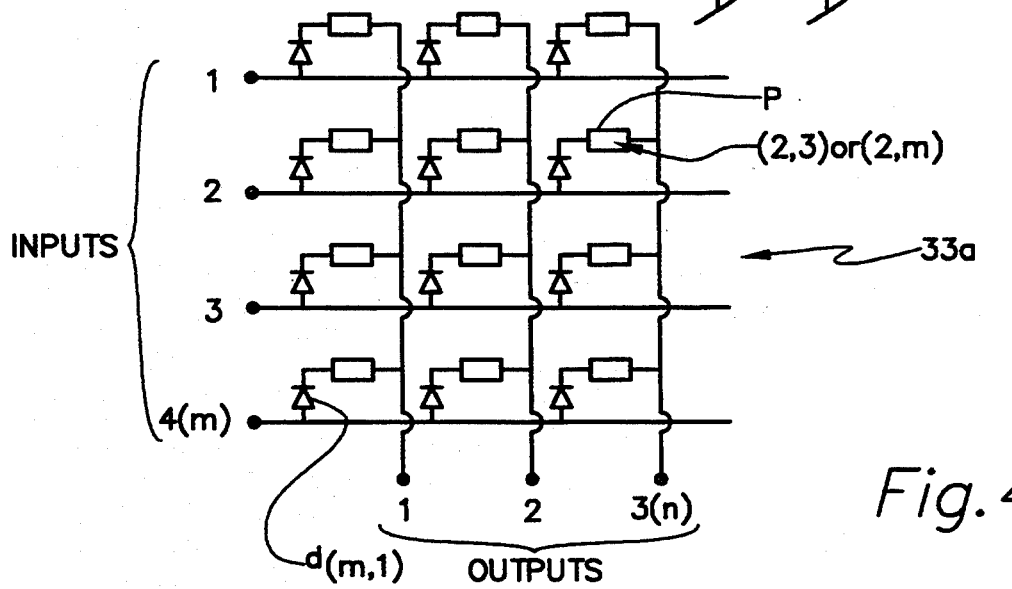
FIG. 4 is an electrical block diagram of a small heuristic focal plane array in accord with one embodiment of the invention.

Referring now to FIG. 4, in which an abbreviated schematic diagram of a focal plane array 33A is heuristically drawn having a number of inputs (here four, but a given number could be m) and a number of outputs (here three, but could be n). The input lines provide a bias current preferably one input line at a time which, using this illustration, would drive the entire row of pixels such as pixel P at address 2,3 also known here as 2,n, to provide an output indicative of their state on the output lines 1-n. In this simplified diagram, each one of the pixels also called elements, units, microbolometers, or bolometers, receive the pulsed current from input line 1-m through a diode d, the one labeled in this diagram being d$_{(m)}$.

A preferred implementation is really a bipolar transistor version of FIG. 4 (attached) because it requires less current to be drawn by the row. Circuit operation is otherwise the same for diodes and transistors. It is also possible to use field effect transistors with very little else changed. Conceptually, the diodes could be considered switches of any kind.

The principle of operation can perhaps be best described with reference to FIG. 6. In the case of the passive pixel whose electrical characteristics are modified by receiving radiation or by changes in their temperature due to receiving such radiation, the graph of temperature and voltage versus time is well suited for illustration purposes. In the most preferred embodiment of course, the pixels or microbolometers and the window is transparent to infrared radiation. The microbolometers change temperature due to the receipt of radiation through the window and the amount of resistance through the microbolometer surface structure, a resistor, is reduced as heat in the microbolometer assembly is increased. The vanadium oxide material we currently prefer (a semiconductor) decreases in resistance as temperature rises. There are other materials (e.g., metals) whose resistance changes in the opposite sense.

Figure 6:
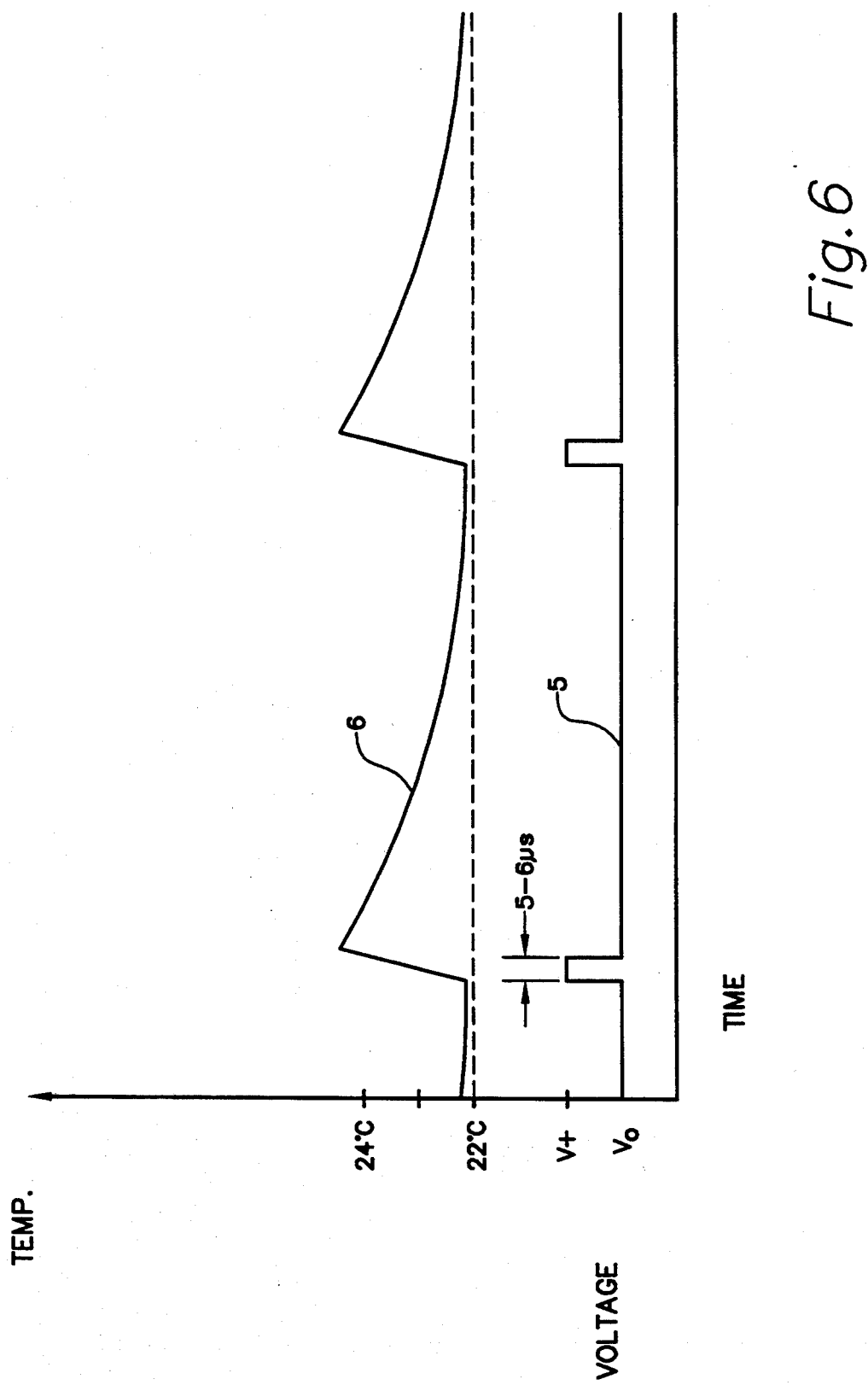
FIG. 6 is a graph of time versus temperature and voltage illustrating the effect of the application of pulse bias voltage to the passive elements of the focal plane array over time.

In FIG. 6 the voltage level indicated by line 5 is that of the pulse biased current supplied to a single microbolometer in a focal plane array over time. In an 80,000 pixel array the pulse width is approximately 5 to microseconds and based on the preferred addressing scheme addressing 14 pixels at a time. The temperature curve 6 shows that a single microbolometer temperature can be raised roughly 2° C. each time the roughly 200 to 300 microamp current pulses them. The 22° Centigrade line is indicated to show the preferred temperature for the focal plane array. Note that the temperature of an individual pixel floats just above the 22° centigrade mark at all times when not pulsed with current. It should be recognized that over and above the temperature variation caused by the bias current pulses illustrated in FIG. 6, incoming radiation from the scene causes an additional temperature variation.

The 22° Centigrade is considered the stabilization temperature for the preferred embodiment focal plane array. At this temperature, a tenth degree temperature change in the microbolometer will produce a perceivable change in resistance, about 0.2%.

Because of the short duration of the time in which to read out signals in an array to produce a moving video image recognizable as a real time image by human beings, high band width amplifiers are used in the preamp 74 of FIG. 1. The large current tends to compensate for the inherent noisiness of these high band width amplifiers. The large bias current that can be safely used with pulsed bias improves the sensitivity of the microbolometers proportionately, tending to compensate for the inherent noisiness of these high-bandwidth amplifiers, and allowing sensitive IR imaging with bolometer arrays.

Pulse biased current schemes have been used to read out information in passive devices previously such as in U.S. Pat. No. 3,900,716 for memory chips. Nevertheless this general scheme has not been applied to focal plane array technologies. Nor even in the earlier instance has it been applied in the way it is done here.

Note that in this invention, because the bias current is applied in short pulses, high bias currents can be used which would damage the pixels if applied continuously. The sensitivity of the microbolometers is higher with pulsed bias current because the sensitivity improves approximately in proportion to the bias current level.

Figure 5:
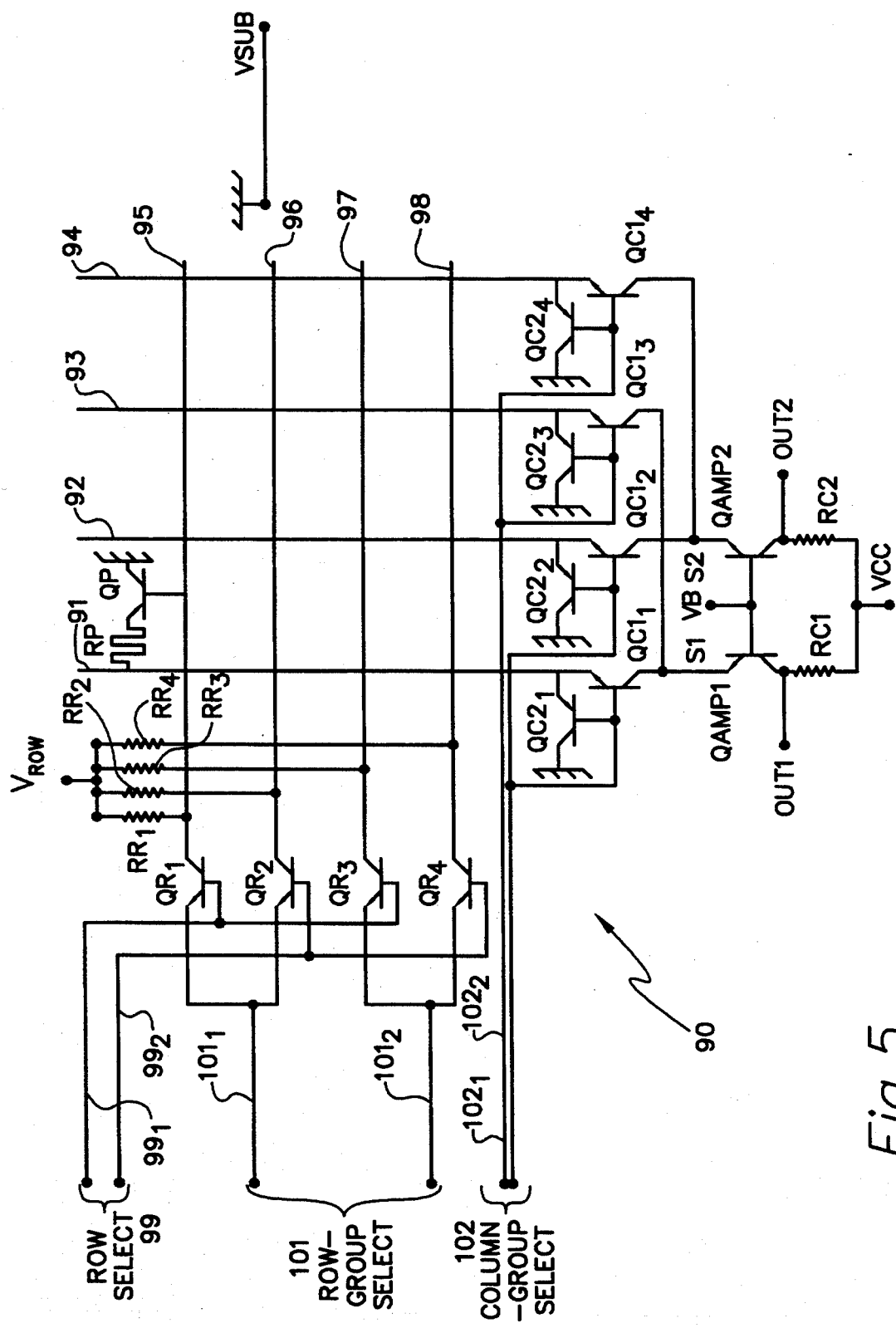
FIG. 5 is an electrical wiring diagram of a small section of the drive circuitry associated with the preferred embodiment focal plane array.

Refer now to FIG. 5 showing a slightly more detailed wiring schematic diagram of a portion of a focal plane array of passive pixels. The only passive pixel illustrated here is the one labeled RP connected between column 91 and row 95 by transistor QP.

Bolometers RP and pixel transistors QP are situated at the intersection of each row and column (one of each of which resides at each row/column intersection but only one of which is shown here). Each row is controlled by transistors $QR_{(1-4)}$ and resistors $RR_{(1-4)}$. Each column is controlled by transistors $QC_{(1-4)}$ and $QC2_{(1-4)}$. Rows are grouped into row-groups with several rows in each row-group (two shown). Columns are grouped into column-groups with several columns in each column-group (two shown). This grouping arrangement allows a large array to be controlled by relatively few control lines (row-group-select, Row-select, column-group-select). Several signal lines S1, S2 shown) carry signals to several preamplifier transistors and resistors (QAMP1, QAMP2, RC1, RC2 shown), providing amplified output signals (OUT1, OUT2 shown).

In operation, one row is biassed to an "ON" potential by application of control signals to row-select and row-group-select control lines, and all other rows are biassed "OFF" by the RR resistors. Simultaneously, control signals are applied to column-group-select lines so as to read out signals from several (two shown) microbolometers RP in that chosen row simultaneously, The readout signal consists of the current flowing into the columns of the selected column-group. The readout signal currents are converted to amplified voltage signals by preamplifier transistors (two shown). Control signals are applied to column-group-select lines until all microbolometers in the chosen row have been read out. Another row is then chosen to be biassed "ON" and the above process repeated. This is continued until all microbolometers in desired rows and columns have been read out.

In this mode of operation, the bias current flowing through the bolometers is in the form of short pulses, and the temperature of the bolometers also varies in a pulsed manner. This pulsed bias operation allows higher bias currents to be applied than would be allowed with continuous bias currents (continuous bias current would have to be kept much smaller to prevent destruction of pixels or bolometers by overheating), and produces a correspondingly higher sensitivity to infrared radiation.

The simultaneous readout of several pixels allows the current pulse duration to be selected to lie at an acceptable value for optimum array operation.

The grouping of the rows and columns into row-groups and column-groups allows a large array to be controlled with relatively few control lines.

VSUB is a bias potential applied to the circuit of FIG. 5. Its purpose is to maintain the transistors biased for proper operation, and to provide a "sink" for the pulsed bias currents. Its name arises from the fact that this connection happens to be the substrate of the silicon chip. VROW is applied to resistors RR to enable these resistors to bias unused rows "OFF".

What is claimed is:

1. An infrared camera having:
    optical assembly (71) which brings light/infrared radiation to a focal plane array (33) of infrared sensitive microbolometers on a semiconductor substrate (30) that is maintained constantly at any selectable temperature, over a wide range, by a thermoelectric temperature stabilizer (20) wherein said thermoelectric temperature stabilizer is regulated by a controller (73) which maintains temperature based on a signal received from a temperature sensor (27) in close thermal association with said array.

2. An infrared camera as set forth in claim 1;
    wherein said focal plane array is swept to produce output signals by a decoder (75) which selects particular column and row addresses in said array by providing a bias current thereto in pulses of short duration in relation to the time required to sweep said array, from a bias current source (76), said selecting of row and column addresses being determined by a logic controller (77) which generated signals setting switches in said decoder in a pattern designed to sweep the entire array at an appropriate rate.

3. An infrared camera as set forth in claim 2;
    wherein the level of bias current pulsed to each pixel is substantially greater than what would be a safe level for each pixel if said pulse were for a long duration.

4. An infrared camera as set forth in claim 2 having substantially serial output of analog signal values returned from said sweep of said focal plane array.

5. An infrared camera as set forth in claim 4, wherein said substantially serial output is produced after receipt of substantially individual analog outputs from said row and column serial sweep by individual preamplifiers for each pixel address, wherein the output of said preamplifiers (74) is received by an analog/digital module (78) which converts each analog value to a digital representation of said analog value and then transfers the converted values to an image processing unit which converts the values received to a standard video output signal.

6. An infrared camera as set forth in claim 1 wherein the stabilization temperature approximates room temperature.

7. An infrared camera as set forth in claim 1 wherein said camera has no chopper.

8. An infrared camera as set forth in claim 1 wherein the thermoelectric stabilizer maintains the focal plane array temperature so constant that no chopper is needed to periodically allow the array to cool by its action of blocking in a periodic manner incident radiation.

9. An infrared camera comprising:
    a substrate having first and second surfaces with an aperture formed therethrough;
    said aperture being surrounded along with an area of said first surface by a contiguous wall structure, said area inside said wall being a bounded surface area;
    a thermoelectric temperature stabilizer mounted firmly to said bounded surface so as to not block said aperture, and having an opposite surface;
    an array of infrared sensitive microbolometers mounted to the opposite surface of said thermoelectric temperature stabilizer, where said array is driven by short pulses from a bias current source;
    a temperature sensor mounted to the opposite surface of said thermoelectric temperature stabilizer in thermal proximity to said array of infrared sensitive microbolometers, said temperature sensor is in electrical connection with a controller which regulates said temperature stabilizer based on a signal received from said temperature sensor; and
    a window for admitting some radiation to said array of infrared sensitive microbolometers mounted to seal-in said thermoelectric temperature stabilizer, temperature sensor, and said array of infrared sensitive microbolometers, in the interior space definable by said first surface, said window for admitting some radiation and said wall structure.

10. The infrared camera of claim 9 wherein a sealable tube member is mounted to said second surface about said aperture.

11. The infrared camera of claim 10, wherein a getter is placed into said tube before sealing.

12. The infrared camera of claim 9 wherein said array is swept to produce output signals by a decoder which selects particular column and row addresses in said array by providing a bias current thereto in short duration pulses from the bias current source, the particular column and row addresses selected are determined by a logic controller which generates signals that set switches in said decoder in a pattern designed to sweep the entire array at an appropriate rate.

13. An infrared camera as set forth in claim 12, wherein the level of bias current pulse to each pixel is substantially greater than what would be a safe level for each pixel if said pulse were for a long duration.

14. An infrared camera as set forth in claim 12, having substantially serial output of analog signal values returned from said array of infrared sensitive microbolometers.

15. An infrared camera as set forth in claim 14, wherein said substantially serial output is produced after receipt of substantially individual analog outputs from said row and column serial sweep by individual preamplifiers for each pixel address, wherein the output of said preamplifiers is received by an analog/digital module which converts each analog value to a digital representation of said analog value and then transfers the converted values to an image processing unit which converts the values received to a standard video output signal.

16. An infrared camera as set forth in claim 9, wherein the stabilization temperature approximates room temperature.

17. An infrared camera as set forth in claim 9, wherein said camera has no chopper.

18. An infrared camera as set forth in claim 9, wherein the thermodectric temperature stabilizer maintains the array of infrared sensitive microbolometers temperature so constant that no chopper is required.

19. Method for reading out changes in passive radiation receiving units in an n by m array of said units which forms a radiation receiving surface including:
 exposing the radiation receiving surface to an irradiated scene desired to be observed, thus developing a change in said receiving units related to the amount of radiation received from said scene,
 sweeping the receiving units with a pulse of short duration, in relation to the time required to sweep said array, of bias current that heats the sensors and is of too large an amperage to allow said units to remain stable if said pulse were of a substantially longer duration than short duration and wherein said sweep is at such a rate that each said unit has time to return to a stabilization temperature before the sweep generates a second short duration bias pulse to each said unit.

* * * * *